US012132139B2

(12) United States Patent
Tsutsui et al.

(10) Patent No.: US 12,132,139 B2
(45) Date of Patent: Oct. 29, 2024

(54) SOLAR CELL PANEL MANUFACTURING APPARATUS, SOLAR CELL PANEL MANUFACTURING METHOD, AND SOLAR CELL PANEL

(71) Applicant: Mitsubishi Electric Corporation, Tokyo (JP)

(72) Inventors: Tomohiro Tsutsui, Tokyo (JP); Akira Inoue, Tokyo (JP); Chinatsu Sanda, Tokyo (JP); Katsumi Ono, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 276 days.

(21) Appl. No.: 17/771,840

(22) PCT Filed: Oct. 5, 2020

(86) PCT No.: PCT/JP2020/037685
§ 371 (c)(1),
(2) Date: Apr. 26, 2022

(87) PCT Pub. No.: WO2021/131219
PCT Pub. Date: Jul. 1, 2021

(65) Prior Publication Data
US 2022/0376129 A1    Nov. 24, 2022

(30) Foreign Application Priority Data
Dec. 27, 2019   (JP) ................................ 2019-237775

(51) Int. Cl.
*H01L 31/18*    (2006.01)
*H01L 31/05*    (2014.01)

(52) U.S. Cl.
CPC ........ *H01L 31/188* (2013.01); *H01L 31/0504* (2013.01)

(58) Field of Classification Search
CPC ... H01L 31/048; H01L 31/0504; H01L 31/18; H01L 31/188
See application file for complete search history.

(56) References Cited

U.S. PATENT DOCUMENTS

2013/0014802 A1    1/2013  Zimmerman

FOREIGN PATENT DOCUMENTS

| JP | H02255460 A | 10/1990 |
| JP | 09181342 A | * 7/1997 |

(Continued)

OTHER PUBLICATIONS

Machine translation of JP-09181342-A, Keiji S. (Year: 1997).*

(Continued)

*Primary Examiner* — Mayla Gonzalez Ramos
(74) *Attorney, Agent, or Firm* — BUCHANAN INGERSOLL & ROONEY PC

(57) ABSTRACT

A solar panel manufacturing apparatus includes a stage on which a substrate is placed, a pressing plate to press an adhesive applied on the substrate and thereby spread the adhesive via a solar cell arranged at a predetermined position on the adhesive, and to retain the position of the solar cell relative to the substrate, and a curing unit to cure only a part of the adhesive spread between the substrate and the solar cell, while the pressing plate is pressing the adhesive and retaining the position of the solar cell relative to the substrate.

16 Claims, 15 Drawing Sheets

(56) References Cited

FOREIGN PATENT DOCUMENTS

| JP | H09181342 A | | 7/1997 | |
|----|----|----|----|----|
| JP | 2001177138 A | * | 6/2001 | |
| JP | 2002211498 A | | 7/2002 | |
| JP | 2005191259 A | * | 7/2005 | ........... H01L 31/188 |
| JP | 2011114205 A | | 6/2011 | |
| JP | 2013030770 A | | 2/2013 | |

OTHER PUBLICATIONS

Machine translation of JP-2001177138-A, Oshiro K. (Year: 2001).*
Machine translation of JP-2005191259-A, Kanishi H. (Year: 2005).*
International Search Report (PCT/ISA/210) with English translation and Written Opinion (PCT/ISA/237) mailed on Dec. 15, 2020, by the Japan Patent Office as the International Searching Authority for International Application No. PCT/JP2020/037685.
Extended European Search Report dated May 17, 2023, issued in the corresponding European Patent Application No. 20905660.5, 9 pages.
Office Action issued in corresponding Japanese Patent Application No. 2021-566831, on Mar. 14, 2023, 12 pages including 6 pages of English translation.

* cited by examiner

SOLAR CELL PANEL MANUFACTURING APPARATUS, SOLAR CELL PANEL MANUFACTURING METHOD, AND SOLAR CELL PANEL

TECHNICAL FIELD

The present disclosure relates to a solar panel manufacturing apparatus, a method of manufacturing a solar panel, and a solar panel.

BACKGROUND ART

Solar panels have been known each including solar cells bonded to a honeycomb panel. For example, Patent Literature 1 discloses a method of bonding solar cells to a honeycomb panel by pressing the solar cells via a cushion and thus spreading an adhesive disposed between the solar cells and the honeycomb panel, and a solar panel manufactured by this bonding method.

CITATION LIST

Patent Literature

Patent Literature 1: Unexamined Japanese Patent Application Publication No. 2002-211498
Patent Literature 2: Unexamined Japanese Patent Application Publication No. H9-181342

SUMMARY OF INVENTION

Technical Problem

The bonding method disclosed in Patent Literature 1 requires continuous pressing until completion of curing of the entire adhesive. This method results in low manufacturing efficiency in mass production of solar panels.

In contrast, Patent Literature 2 discloses a method of bonding a cover glass to a solar cell. The bonding method disclosed in Patent Literature 2 involves pressing the cover glass aligned to the proper position by alignment pins, and partially heating the surface of the cover glass to cure an adhesive between the solar cell and the cover glass. The solar cells and the cover glasses bonded with the partially cured adhesives are then introduced in an oven to cure the rest of the adhesive. If the bonding method disclosed in Patent Literature 2 is used to bond solar cells to a honeycomb panel, the honeycomb panel requires alignment pins. This configuration takes more time to partially bond the solar cells to the honeycomb panel, resulting in low efficiency in manufacturing of the solar panels.

An objective of the present disclosure, which has been accomplished in view of the above situations, it to provide a solar panel manufacturing apparatus that can be manufactured with high efficiency, a method of manufacturing a solar panel, and a solar panel.

Solution to Problem

In order to achieve the above objective, a solar panel manufacturing apparatus according to an aspect of the present disclosure includes a stage, a pressing plate, and a curing unit. A substrate is placed on the stage. The pressing plate presses an adhesive applied on the substrate and thereby spreads the adhesive via a solar cell arranged at a predetermined position on the adhesive, and retains the position of the solar cell relative to the substrate. The curing unit cures only a part of the adhesive spread between the substrate and the solar cell, while the pressing plate is pressing the adhesive and retaining the position of the solar cell relative to the substrate.

Advantageous Effects of Invention

Since the pressing plate spreads the adhesive and the curing unit cures only a part of the spread adhesive, the present disclosure can achieve high manufacturing efficiency.

DESCRIPTION OF EMBODIMENTS

A solar panel manufacturing apparatus, a method of manufacturing a solar panel, and a solar panel according to embodiments of the present disclosure are described below with reference to the accompanying drawings.

Embodiment 1

Figure 1:
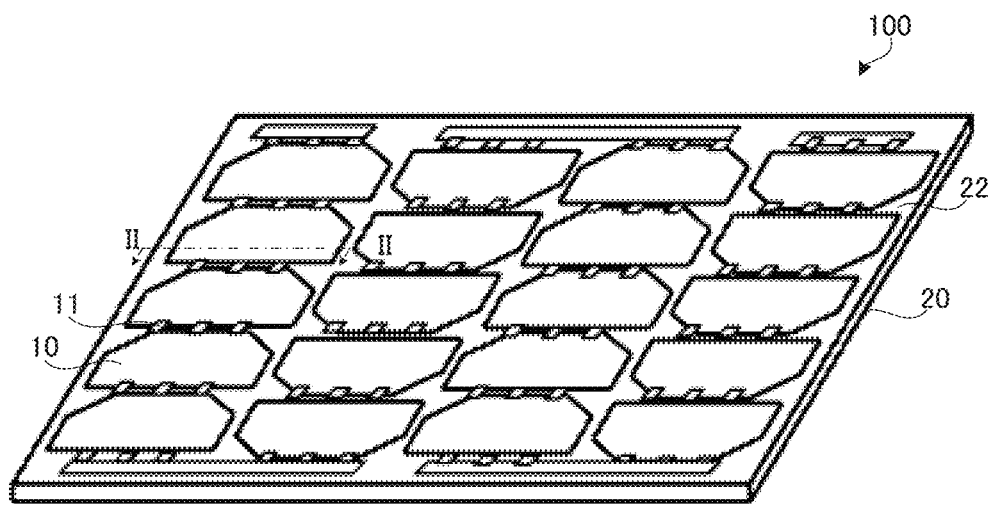
FIG. 1 is a perspective view of a solar panel according to Embodiment 1.
Figure 2:
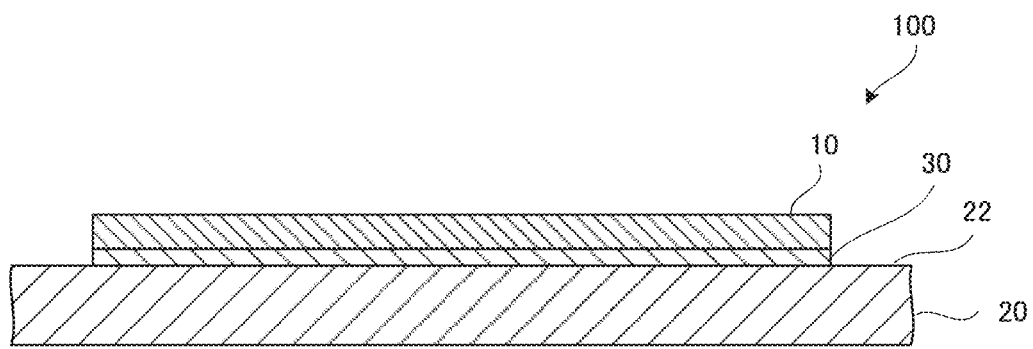
FIG. 2 is a sectional view of the solar panel illustrated in FIG. 1 taken along the ire II-II.

The description is first directed to a solar panel 100, which is manufactured with a solar panel manufacturing apparatus 200 and by a method of manufacturing a solar panel according to this embodiment, with reference to FIGS. 1 and 2. As illustrated in FIG. 1, the solar panel 100 includes a substrate 20, a plurality of solar cells 10 arranged on the substrate 20 and bonded to the substrate 20, and wires 11 to connect the solar cells 10 to each other. The solar panel 100 is installed in an artificial satellite, for example. The solar panel 100 may be installed in an artificial satellite in combination with a frame or a panel made of a carbon fiber composite material, an extendable reinforcing member, or an aluminum housing.

The solar cells 10 are of single crystal silicon solar cell, for example. As illustrated in FIG. 2, which is a sectional view taken along the line II-II, each of the solar cells 10 is bonded to one main surface 22 of the substrate 20 with an adhesive 30. The light-receiving surface of the solar cell 10 may be covered with a cover glass.

The wires 11 connect the solar cells 10 to electrodes as appropriate.

The substrate 20 is made of a flexible and rollable sheet or a honeycomb panel, for example. The honeycomb panel includes an aluminum honeycomb core and plates made of a carbon fiber composite material and provided on both surfaces of the honeycomb core, for example. A typical example of the flexible and rollable sheet is a polyimide sheet.

The adhesive 30 is a thermosetting adhesive, which cures when heated to a curing temperature or higher, for example. The adhesive 30 spreads into the form of a thin film between each solar cell 10 and the substrate 20 and bonds the solar cell 10 to the substrate 20.

The description is then directed to the solar panel manufacturing apparatus 200 for manufacturing the solar panel 100 having the above-described configuration and the method of manufacturing the solar panel 100, with reference to FIGS. 3 to 12.

Figure 3:
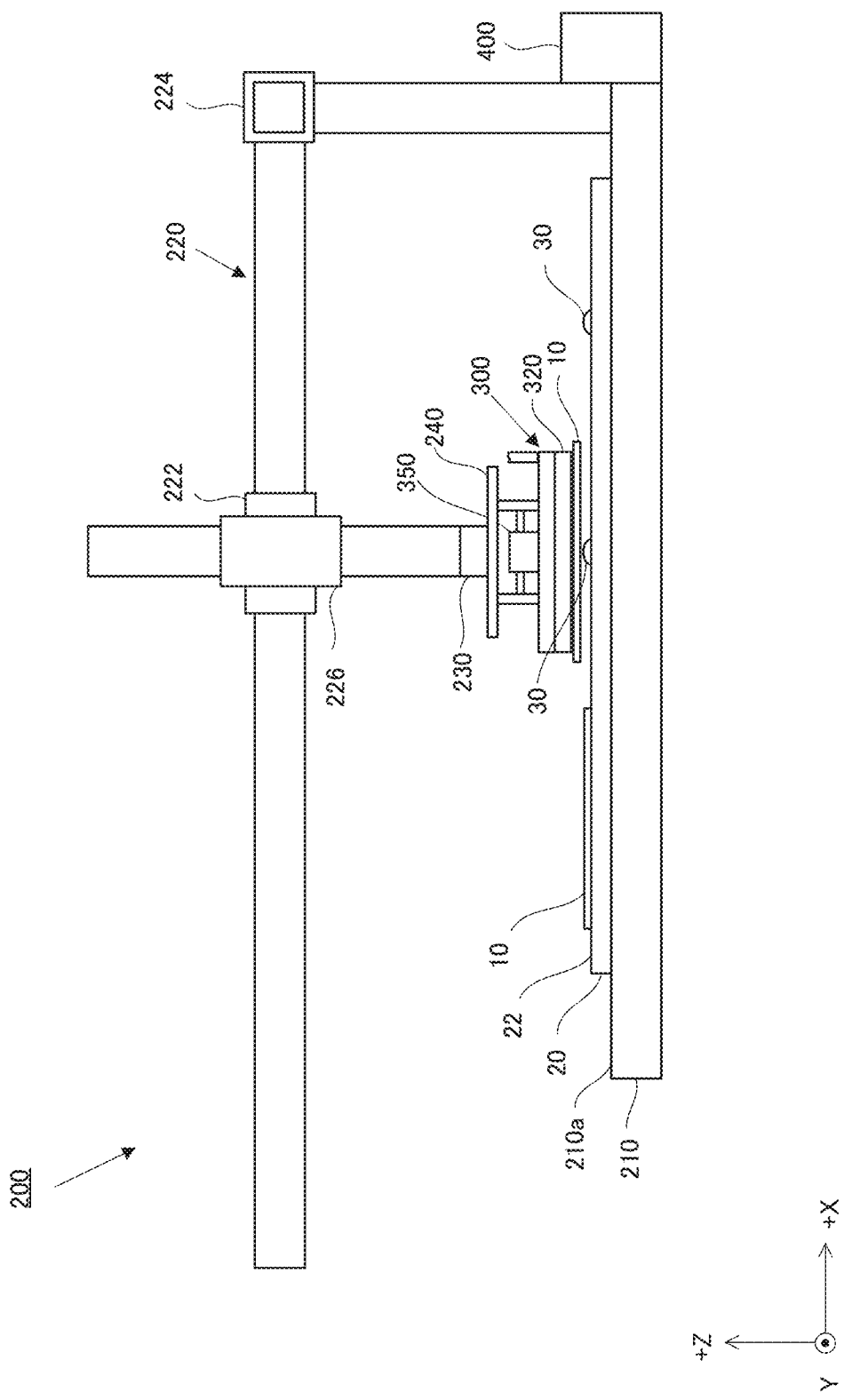
FIG. 3 illustrates a solar panel manufacturing apparatus according to Embodiment 1.

As illustrated in FIG. 3, the solar panel manufacturing apparatus 200 includes a stage 210 on which the substrate 20 is placed, a transport mechanism 220 to transport a head 300, which is described below, a load meter 230, and a joint 240 that couples the transport mechanism 220 to the head 300. The solar panel manufacturing apparatus 200 further includes the head 300 to arrange the solar cells 10 on the adhesive 30 applied on the substrate 20 and press the adhesive 30 and thus spread the adhesive 30, a heating unit 350 to cure only a part of the spread adhesive 30, and a controller 400 to control the individual components.

In order to facilitate an understanding, the description assumes that the upward direction in FIG. 3 is the +Z direction, the downward direction, that is, the vertically downward direction is –Z direction, the leftward direction is –X direction, the rightward direction is +X direction, the direction toward the rear side of the plane of the figure is –Y direction, and the direction toward the front side of the plane of the figure is +Y direction.

The stage 210 is a flat metal plate. The stage 210 has a surface 210a on which the substrate 20 of the solar panel 100 is placed. The substrate 20 is fixed on the surface 210a of the stage 210 with a jig, which is not illustrated. The main surface 22 of the substrate 20 is provided with the adhesive 30 at positions of the solar cells 10 to be arranged. The surface 210a of the stage 210 on which the substrate 20 is placed may be made of a resin. In the case of the substrate 20 made of a thin polyimide sheet, the surface 210a is preferably made of a resin having a lower thermal conductivity than those of metals.

The transport mechanism 220 shifts the head 300 in each of the ±X directions, ±Y directions, and ±Z directions. The transport mechanism 220 includes an X-direction driver 222, a Y-direction driver 224, and a Z-direction driver 226, which are orthogonal to each other. The Z-direction driver 226 is coupled to the head 300 with the joint 240.

The X-direction driver 222 is provided to the Y-direction driver 224 and shifts the head 300 in each of the ±X directions. The Y-direction driver 224 is provided on the surface 210a of the stage 210. The Y-direction driver 224 shifts the X-direction driver 222 in each of the ±Y directions and thereby shifts the head 300 in each of the ±Y directions. The Z-direction driver 226 is provided to the X-direction driver 222 and shifts the head 300 in each of the ±Z directions. The X-direction driver 222, the Y-direction driver 224, and the Z-direction driver 226 each include a motor, a ball screw, and a slider, which are not illustrated, for example.

The load meter 230 is disposed between the Z-direction driver 226 and the joint 240. The load meter 230 measures a pressure applied to the adhesive 30. The load meter 230 includes a compressed load cell, for example.

The joint 240 includes a metal plate, for example. The joint 240 couples the end of the Z-direction driver 226 to the head 300 via the load meter 230.

Figure 4:
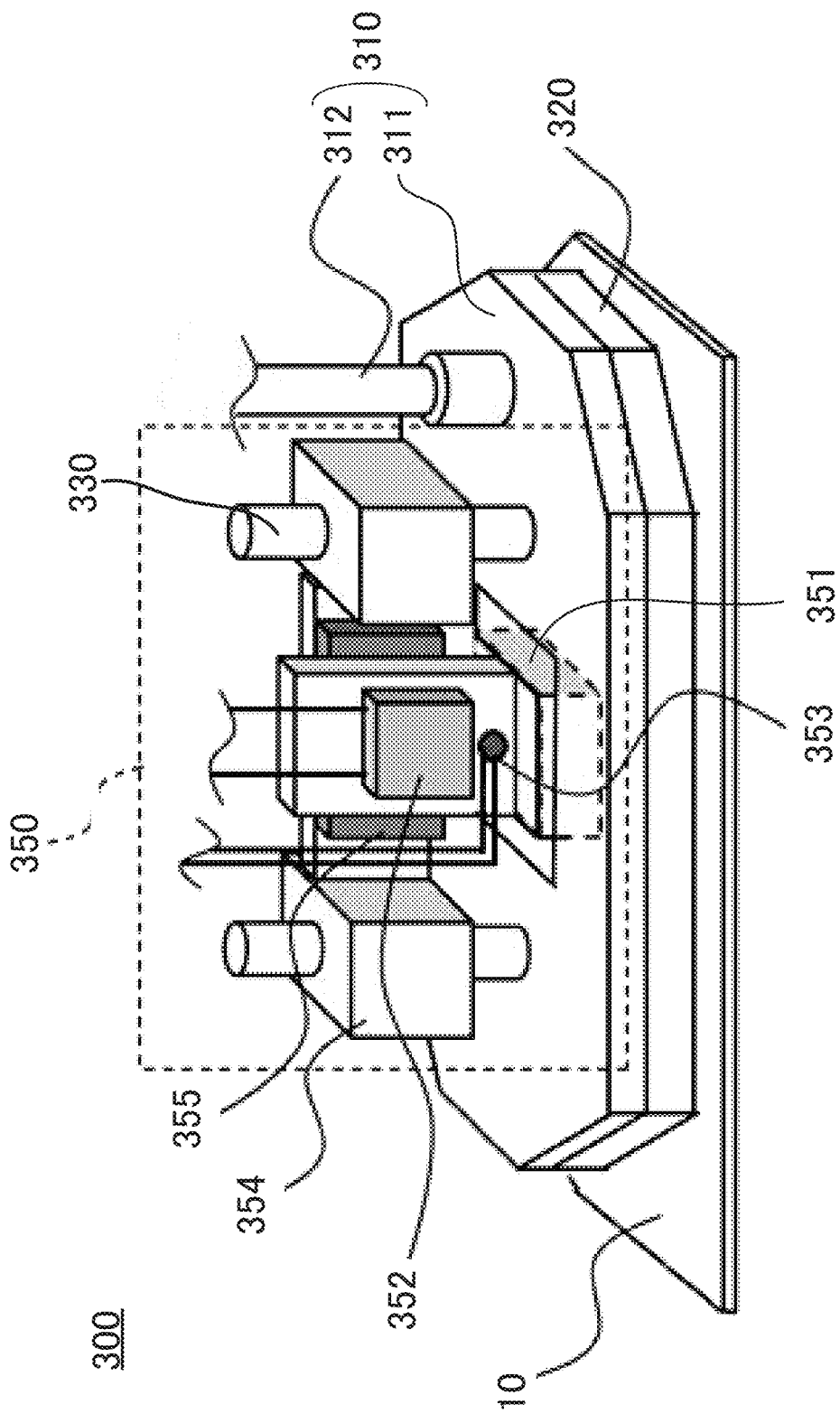
FIG. 4 is a perspective view of a head of the solar panel manufacturing apparatus according to Embodiment 1.

The head 300 has a function of attracting a solar cell 10 and pressing the solar cell 10. As illustrated in FIG. 4, the head 300 includes a suction unit 310 to attract the solar cell 10, a pressing plate 320 to press the adhesive 30 via the attracted solar cell 10, and supports 330.

The suction unit 310 attracts the solar cell 10 via the pressing plate 320. The suction unit 310 includes a suction plate 311 and a vacuum pipe 312, for example.

The suction plate 311 is shaped as a plate. One end of the suction plate 311 is open on the lower surface. The other end of the suction plate 311 includes a plurality of intake passages. The intake passages are continuous to the vacuum pipe 312. The vacuum pipe 312 is connected to a vacuum pump via a valve, which is not illustrated. The suction unit 310 sucks air from the lower surface of the suction plate 311 through the vacuum pipe 312 and the intake passages, and thereby attracts the solar cell 10.

The pressing plate 320 presses the solar cell 10 on the upper surface of the solar cell 10. The pressing plate 320 also retains the position of the solar cell 10 relative to the substrate 20. The pressing plate 320 includes a flat plate provided on the lower surface of the suction plate 311. The pressing plate 320 includes intake passages in communication with the intake passages of the suction plate 311. The intake passages are open on the lower surface of the pressing plate 320. In the case where the processing target is a wavy solar cell 10, the pressing plate 320 is preferably made of an elastic material so as to follow the shape of the solar cell 10. A typical example of the elastic material is ethylene-propylene-diene monomer (EPDM) rubber. The lower surface of the pressing plate 320 preferably has protrusions and recesses in accordance with the shape of the solar cell 10 so as to process even a thin and fragile solar cell 10. The pressing plate 320 is preferably smaller than the contour shape of the solar cell 10 in order to prevent the overflowing adhesive 30 from adhering to the pressing plate 320. Alternatively, the pressing plate 320 may be provided with suction holes for vacuum attraction and integrated with the suction plate 311.

The supports 330 fix the suction plate 311 to the joint 240.

The heating unit 350 heats and thereby cures a part of the layer of the adhesive 30. The heating unit 350 includes a heat conductor 351 made of a material having a high thermal conductivity, a heater 352 to emit heat, a temperature sensor 353 to measure a temperature of the heat conductor 351, a support 354, and a heat insulator 355.

The heat conductor 351 is made of a material having a high thermal conductivity. A typical example of the material having a high thermal conductivity is aluminum. The lower end of the heat conductor 351 is exposed to the opening formed in the suction plate 311 and the pressing plate 320. The lower surface of the heat conductor 351 is a flat surface that can come into contact with the attracted solar cell 10.

The heater 352 is a ceramic heater, for example. The heater 352 is fixed to the heat conductor 351. The heater 352 emits heat when energized.

The temperature sensor 353 includes a thermistor and wires, for example. The temperature sensor 353 is fixed to the heat conductor 351. The temperature sensor 353 measures a temperature of the heat conductor 351 and feeds the measured temperature back to the controller 400.

The support 354 supports the heat conductor 351. The support 354 also fixes the heat conductor 351 to the supports 330 of the head 300. The support 354 preferably supports the heat conductor 351 such that the heat conductor 351 can shift in the Z directions in which the pressing plate 320 presses the adhesive 30. The heat conductor 351 can thus relatively move in the Z directions so as to follow the height of the surface of the solar cell 10 and thereby remain in contact with the solar cell 10. The support 354 preferably supports the heat conductor 351 such that the heat conductor 351 can be inclined so as to follow the inclination of the surface of the solar cell 10. The heat conductor 351 can thus be inclined so as to follow the inclination of the surface of the solar cell 10 and thereby remain in contact with the solar cell 10. The contact force of the heat conductor 351 on the solar cell 10, that is, the contact force of the heating unit 350 on the solar cell 10 can be controlled by the own weight of the heating unit 350, a weight provided to the heating unit 350, or springs provided to the supports 330 of the head 300, for example.

The heat insulator 355 is disposed between the heat conductor 351 and the support 354. The heat insulator 355 fixes the heat conductor 351 to the supports 330 while preventing the heat of the heater 352 from being transferred to other portions of the head 300. A typical example of the heat insulator 355 is a heat-insulating plate. The heat-insulating plate includes glass fibers as a substrate, for example.

Figure 5:
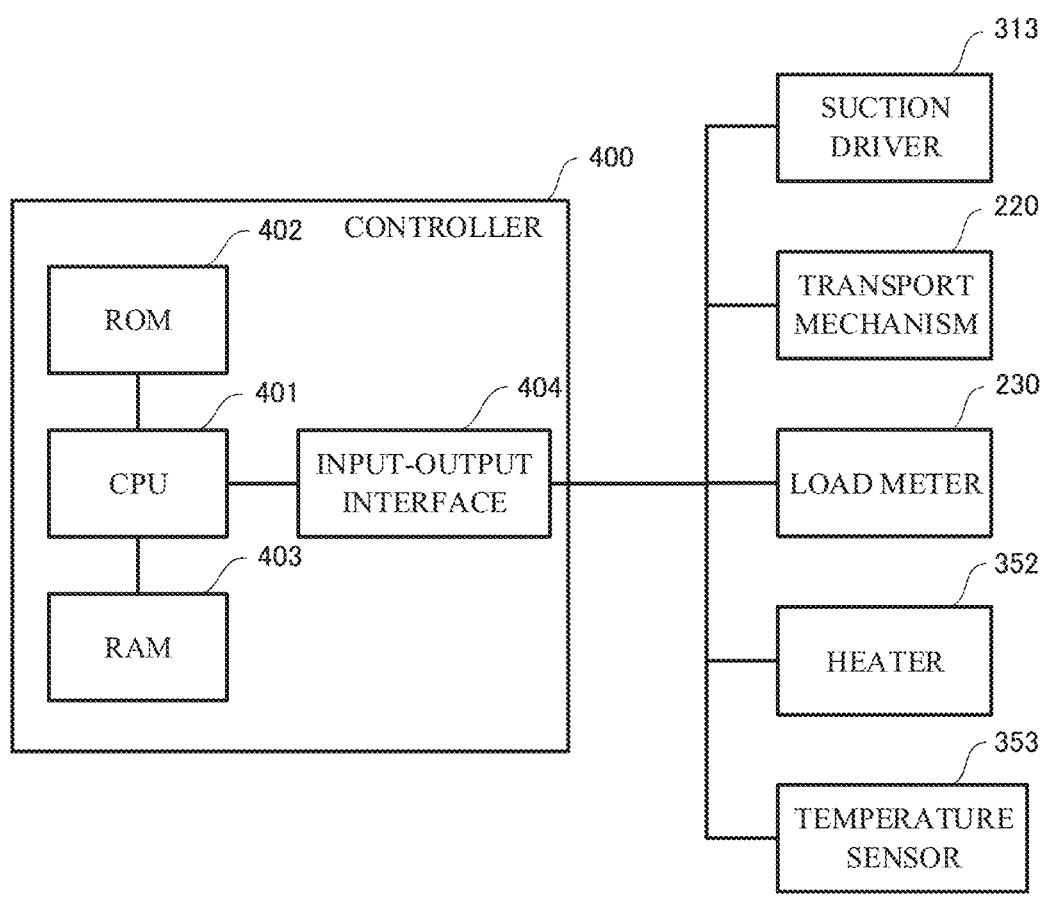
FIG. 5 is a block diagram illustrating a controller of the solar panel manufacturing apparatus according to Embodiment 1.

The controller 400 illustrated in FIG. 3 controls the entire operations for bonding the solar cells 10 on the substrate 20. In order to achieve this control, the controller 400 includes a central processing unit (CPU) 401 to execute a program, a read-only memory (ROM) 402 to store the program, a random access memory (RAM) 403 to serve as a work area of the CPU 401, and an input-output interface 404 for communication with external devices, as illustrated in FIG. 5.

The CPU 401 executes an operational program stored in the ROM 402 using the RAM 403 as a work area, and thus performs a method of manufacturing the solar panel 100, which is described below with reference to FIG. 6.

Specifically, the CPU 401 controls a suction driver 313, Which includes the above-mentioned valve and vacuum pump, for example, and thus causes the head 300 to attract the solar cell 10. The CPU 401 controls the above-mentioned transport mechanism 220 and thus causes the head 300 to transport the solar cell 10 in each of the ±X, ±Y, and ±Z directions. The CPU 401 controls the Z-direction driver 226 such that the pressing plate 320 of the head 300 presses the solar cell 10 in the −Z direction. The CPU 401 also monitors a load applied to the solar cell 10 on the basis of the value measured at the load meter 230. When the load applied to the solar cell 10 exceeds a reference value, the CPU 401 controls the Z-direction driver 226 and thus causes the head 300 to shift in the +Z direction. This control can protect the solar cell 10 from an excessive load. Furthermore, the CPU 401 controls the heater 352 so as to heat the heat conductor 351 to a target temperature, thereby heating and curing a part of the layer of the adhesive 30 between the substrate 20 and the solar cell 10. Since the CPU 401 allows the adhesive 30 to cure by heating, the target temperature of the heat conductor 351 is set to approximately 5° C. to 10° C. higher than the curing temperature of the adhesive 30. In contrast, the temperature of the pressing plate 320 is set to approximately 60° C. so as not to increase the viscosity of the adhesive 30 even during continuous running. The CPU 401 also controls the amount of heat emitted from the heater 352 on the basis of the fed back temperature measured at the temperature sensor 353. The CPU 401 includes a timer.

The description is then directed to a method of manufacturing the solar panel 100 with the solar panel manufacturing apparatus 200, with reference to FIGS. 6 to 12.

Figure 6:
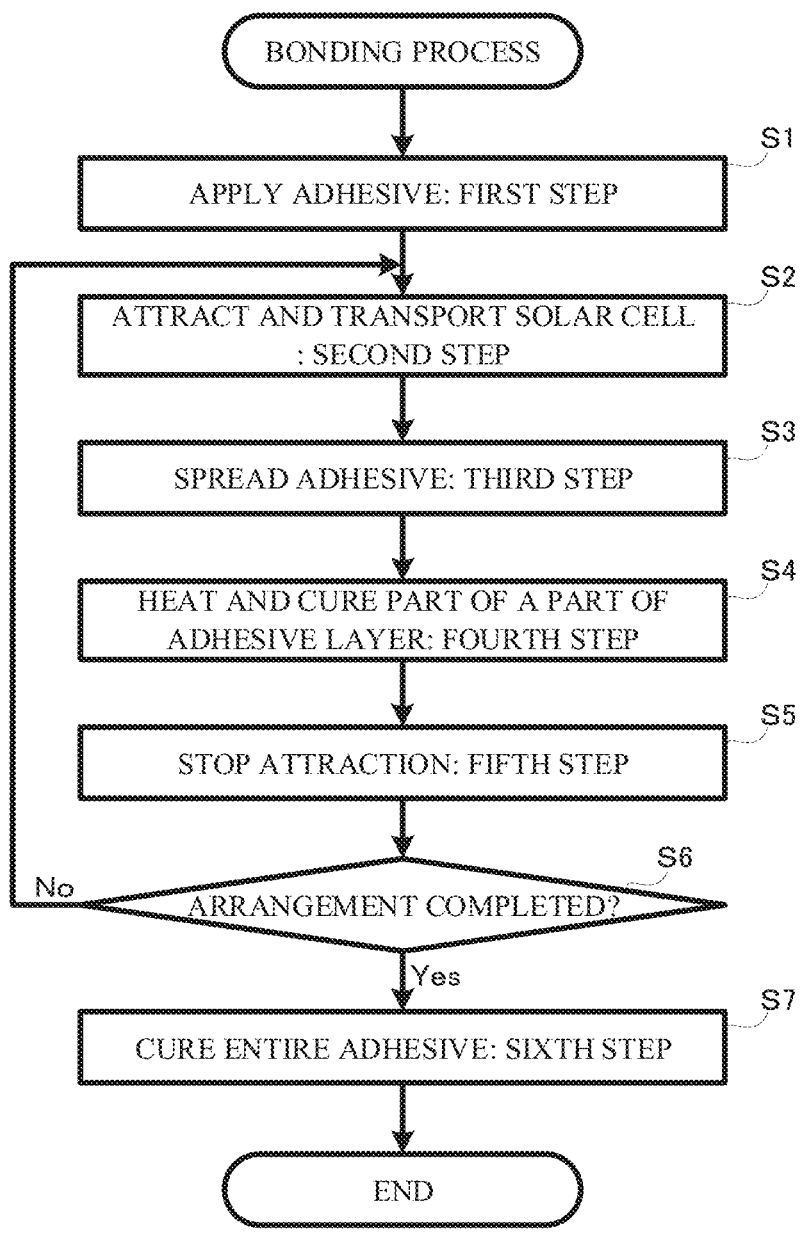
FIG. 6 is a flowchart illustrating a method of manufacturing a solar panel according to Embodiment 1.

The method of manufacturing the solar panel 100 is executed in accordance with the steps in the flowchart illustrated in FIG. 6.

Figure 7:
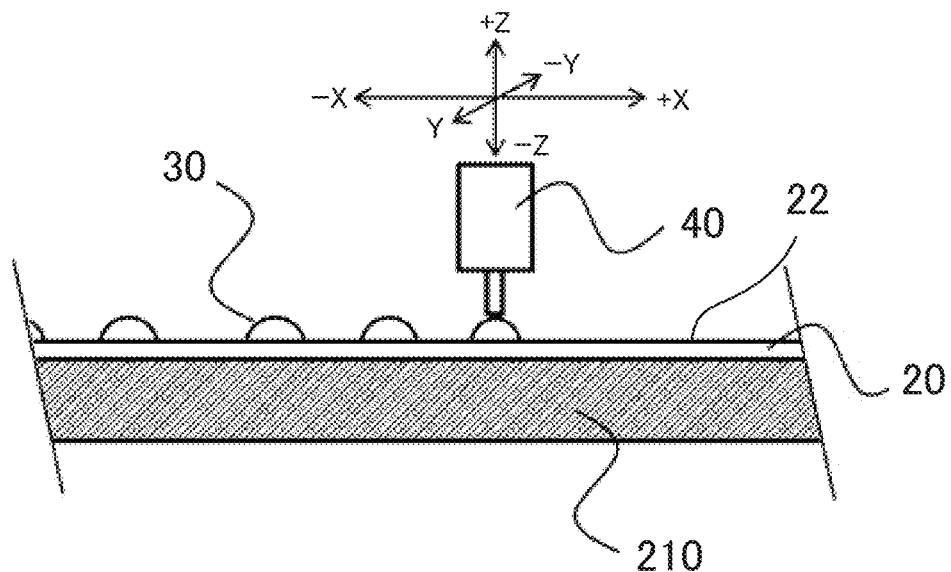
FIG. 7 is a diagram for describing a first step of the method of manufacturing a solar panel according to Embodiment 1.

First, as illustrated in FIG. 7, the adhesive 30 is applied on the main surface 22 of the substrate 20 with an applicator 40, such as dispenser or brush (first step: Step S1). The adhesive 30 is preferably applied in patterns, such as dot patterns or radial line patterns, in order to avoid introduction of bubbles during pressing in a third step, which is described below. The controlled amount of adhesive 30 is applied at controlled positions in this step.

Then, the substrate 20 provided with the adhesive 30 is placed on the surface 210a of the stage 210 and fixed on the surface 210a. The substrate 20 provided with the adhesive 30 is preferably placed on the surface 210a without being turned upside down. This operation can prevent the adhesive 30 from being displaced and failing to form proper application patterns.

Figure 8:
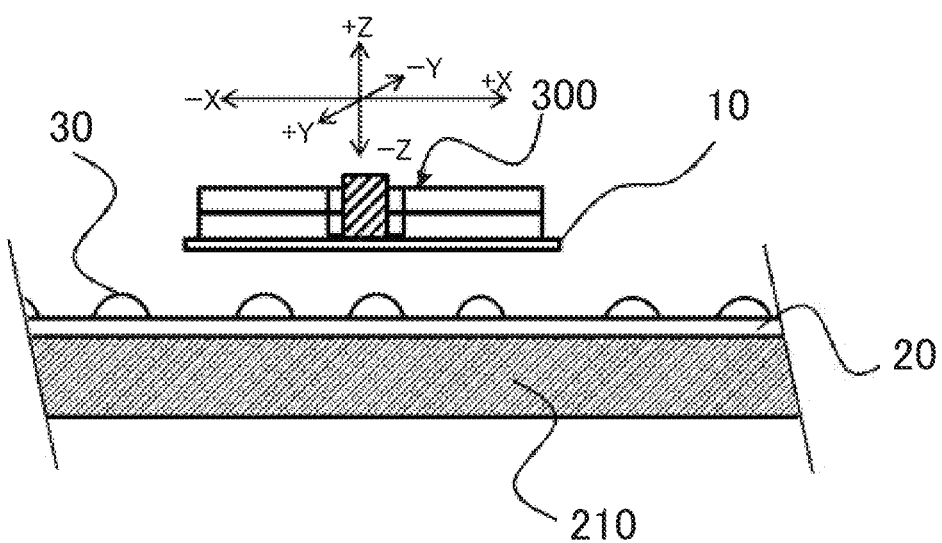
FIG. 8 is a diagram for describing a second step of the method of manufacturing a solar panel according to Embodiment 1.

The CPU 401 then controls the suction driver 313 and thus causes the head 300 to attract the solar cell 10, as illustrated in FIG. 8. The CPU 401 then controls the transport mechanism 220 so as to transport the attracted solar cell 10 to a position right above the position of the solar cell 10 to be arranged on the substrate 20 (second step: transport step: Step S2). The position of the solar cell 10 relative to the substrate 20 may be determined by controlling the position of the head 300 relative to the stage 210 using a pattern recognition technique.

Figure 9:
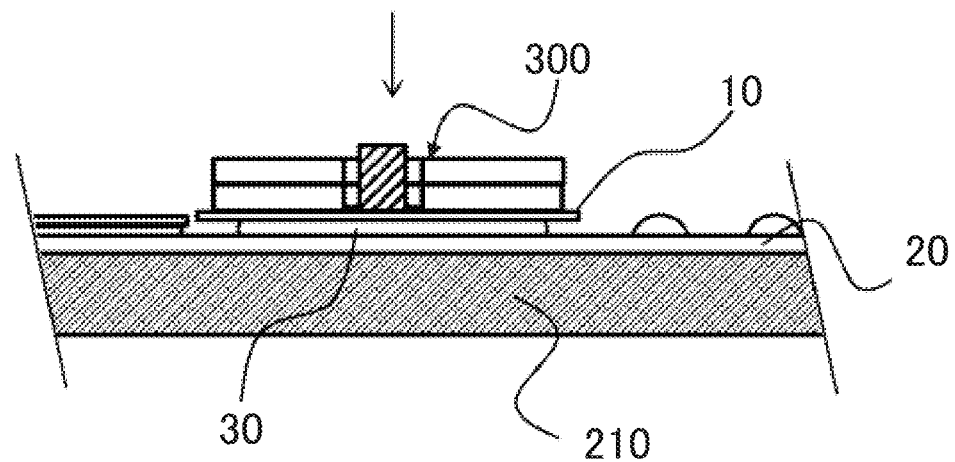
FIG. 9 is a diagram for describing a third step of the method of manufacturing a solar panel according to Embodiment 1.

The CPU 401 then controls the Z-direction driver 226 and thus lowers the head 300, as illustrated in FIG. 9, so as to spread the adhesive 30 between the solar cell 10 and the substrate 20 into the form of a layer (third step: pressing step: Step S3). The CPU 401 controls the pressing force of the head 300 on the basis of the fed back value measured at the load meter 230, and continues to control the pressing force until the elapse of a predetermined period. The target pressing force is determined after preliminary examination of a force capable of sufficient spreading of the adhesive 30. The predetermined period required for sufficient spreading of the adhesive 30 is also determined after preliminary examination. When the value measured at the load meter 230 exceeds the reference value, the CPU 401 controls the Z-direction driver 226 so as to raise the head 300, and thereby protects the solar cell 10 from an excessive load.

Figure 10:
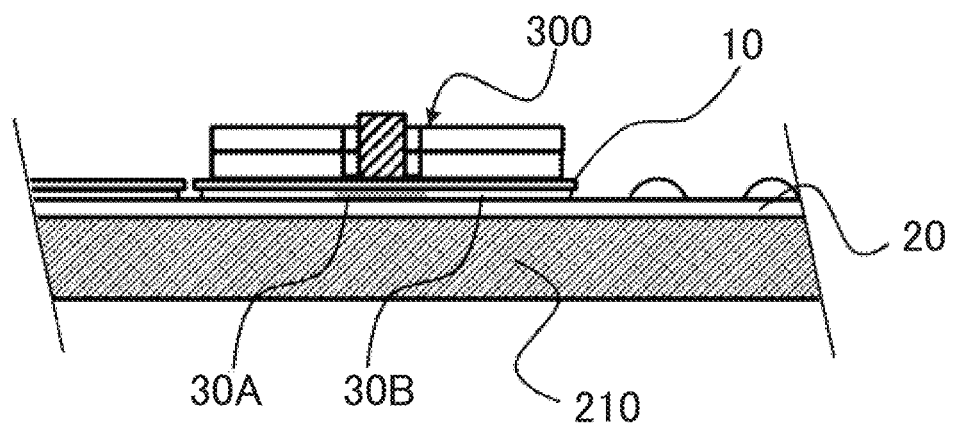
FIG. 10 is a diagram for describing a fourth step of the method of manufacturing a solar panel according to Embodiment 1.

Then, as illustrated in FIG. 10, the spread adhesive 30 is partially cured while the position of the solar cell 10 relative to the substrate 20 is retained and the adhesive 30 is being pressed (fourth step: curing step: Step S4). In detail, the CPU 401 causes the heater 352 to emit heat by energization. The heat from the heater 352 is transferred via the heat conductor 351 and the solar cell 10 to the adhesive 30. The heat from the heater 352 then increases the temperature of a part of the layer of the adhesive 30. In the case of the surface 210a of the stage 210 made of a resin having a low thermal conductivity, the surface 210a can prevent the heat from being diffused to the stage 210 and thereby accelerate the temperature rise in the adhesive 30.

The CPU 401 also monitors the temperature of the heat conductor 351 using the temperature sensor 353. The CPU 401 increases the temperature of the heat conductor 351 to the curing temperature of the adhesive 30 and then maintains the temperature during the curing process. Although the target temperature of the heat conductor 351 varies depending on the used adhesive 30, the heat conductor 351 is maintained at 120° C. for approximately three minutes, for example. After this step, the adhesive 30 has a partially cured portion 30A and an uncured portion 30B. The adhesive 30 in which only the cured portion 30A is cured has a sufficient strength for retaining the position of the solar cell 10 relative to the substrate 20 regardless of transport of the substrate 20.

Figure 11:
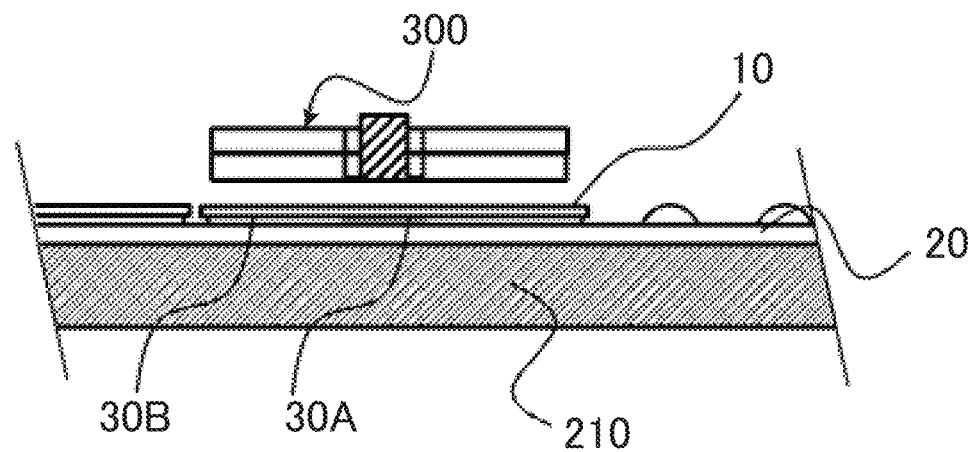
FIG. 11 is a diagram for describing a fifth step of the method of manufacturing a solar panel according to Embodiment 1.
Figure 12:
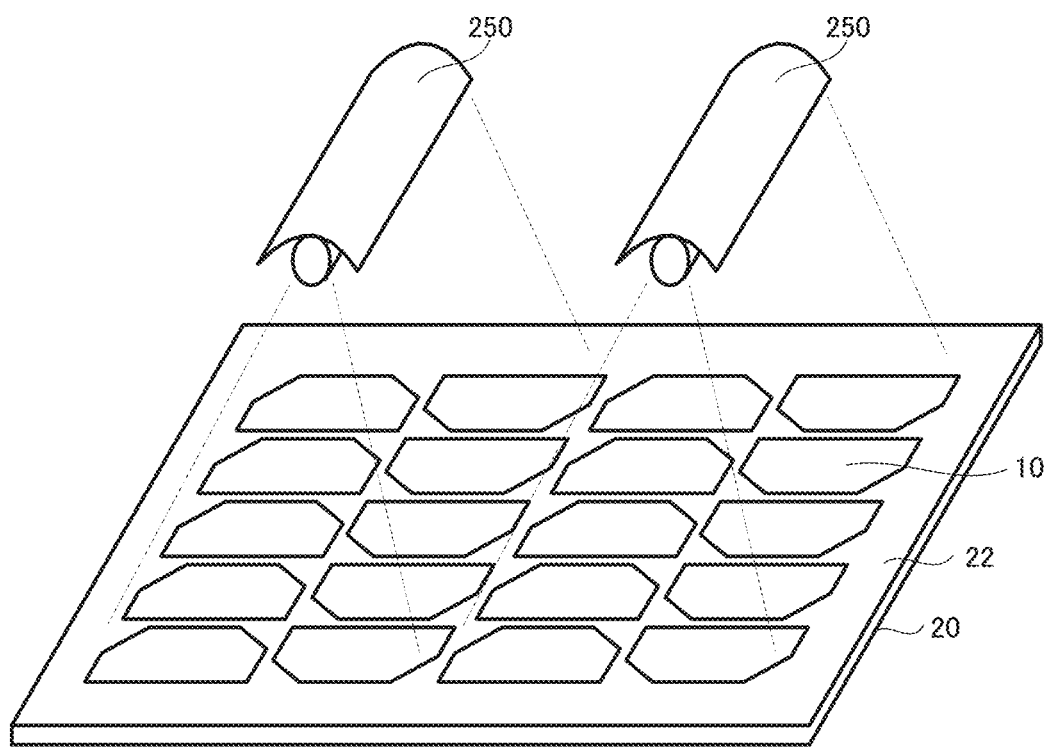
FIG. 12 is a diagram for describing a sixth step of the method of manufacturing a solar panel according to Embodiment 1.

The CPU 401 then controls the suction driver 313 and thus stops attracting the head 300, as illustrated in FIG. 11. The CPU 401 then controls the transport mechanism 220 and thus causes the head 300 to recede from the stage 210 (fifth step: Step S5). The position of the solar cell 10 relative to the substrate 20 and the gap between the solar cell 10 and the substrate 20 can be retained by the cured portion 30A of the adhesive 30 even after receding of the head 300.

Subsequent to the step of receding of the head 300, the CPU 401 determines whether arrangement of a designated number of solar cells 10 on the substrate 20 has been completed (Step S6). When the arrangement of a designated number of solar cells 10 has not been completed (Step S6: No), the process returns to the second step for transport of a subsequent solar cell 10. The designated number is preliminarily determined depending on the number of solar cells 10 to be arranged on a single substrate 20.

When determining that the arrangement of the designated number of solar cells 10 has been completed (Step S6: Yes), the process goes to an entire curing step (sixth step: step of curing the rest of the adhesive 30: Step S7) for curing the uncured portion 30B of the adhesive 30. In the sixth step, the uncured portion 30B on the substrate 20 provided with the designated number of solar cells 10 is cured at a room temperature. Alternatively, the uncured portion 30B may be cured by heating the entire substrate 20 using a heating device, such as infrared-ray heaters 250 illustrated in FIG. 12, or a constant temperature bath in which hot wind circulates.

The adjacent solar cells 10 are then connected with electric wires or bus bars, thereby completing the solar panel 100 illustrated in FIG. 1.

As described above, the solar cell 10 can be pressed with an appropriate pressure to spread the adhesive 30 in this embodiment. The substrate 20 provided with the adhesive 30 is not turned upside down and can therefore prevent the adhesive 30 from failing to form proper application patterns and reduce bubbles generated in the adhesive 30.

In this embodiment, the heating unit 350 cures a part of the adhesive 30 while the pressing plate 320 is pressing the adhesive 30 and retaining the position of the solar cell 10 relative to the substrate 20. This configuration can efficiently determine the positions of a plurality of solar cells 10 on the substrate 20 for a short period. The heating unit 350 is smaller than the pressing plate 320 and thus has a lower heat capacity, and therefore requires shorter times until a temperature rise and a temperature drop of the heating unit 350. The heat conductor 351 of the heating unit 350 is supported by the support 354 such that the heat conductor 351 can shift in the Z directions and can be inclined so as to follow the inclination of the surface of the solar cell 10, and therefore can come into contact with the shape of the surface of the solar cell 10. This configuration can reduce the thermal resistance between the heat conductor 351 and the solar cell 10 and can thus cure a part of the adhesive 30 in a short period. The solar panel manufacturing apparatus 200 can therefore efficiently bond a plurality of solar cells 10 to the substrate 20 in a short period. The method of manufacturing the solar panel 100 according to this embodiment can achieve efficient bonding of the solar cells 10 to the substrate 20 in a short period.

Since the solar cells 10 are arranged by the head 300 in this embodiment, the positions of the solar cells 10 can be determined without a member that comes into contact with the solar cells 10 to determine their positions. This configuration can reduce damage in the solar cells 10. The thickness of the layer of the adhesive 30 can be controlled by adjusting the time from the spreading of the adhesive 30 until the temperature rise of the heating unit 350. The thickness of the layer of the adhesive 30 can also be controlled by adjusting the pressing force of the pressing plate 320 on the adhesive 30 and the contact force of the heating unit 350 on the solar cell 10.

Embodiment 2

The lower surface of the heat conductor 351 is flush with the lower surface of the pressing plate 320 in Embodiment 1. In this case, the lower surface of the heat conductor 351 is in contact with the solar cell 10 while the pressing plate 320 is pressing the solar cell 10, so that the heating unit 350 heats the adhesive 30 and thus increases the viscosity of the adhesive 30. The adhesive 30 spreads in different manners depending on its viscosity despite of the identical pressing force on the adhesive 30. That is, an increase in the viscosity of the adhesive 30 preferably occurs after the spreading of the adhesive 30.

Figure 13:
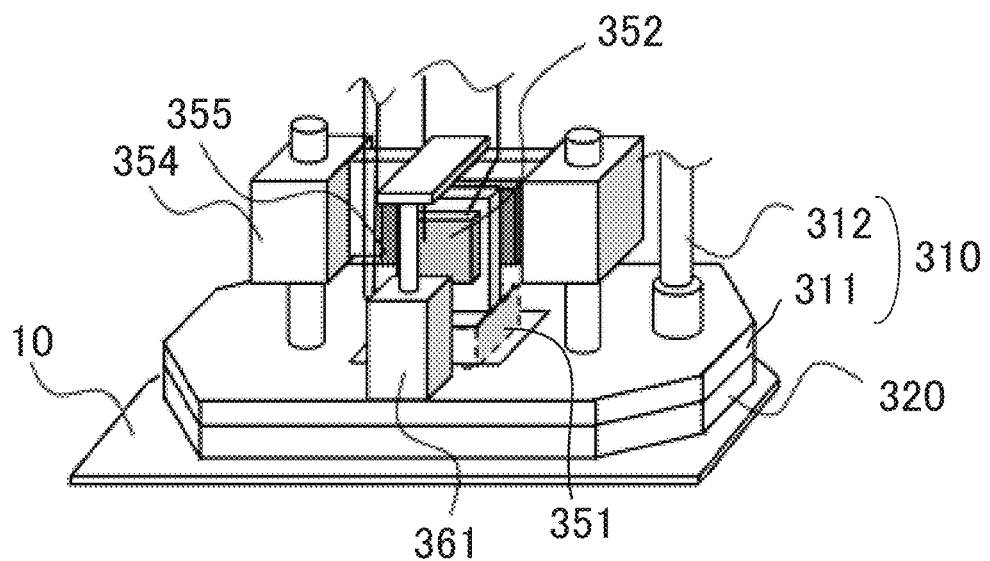
FIG. 13 is a perspective view of a head of a solar panel manufacturing apparatus according to Embodiment 2.
Figure 14:
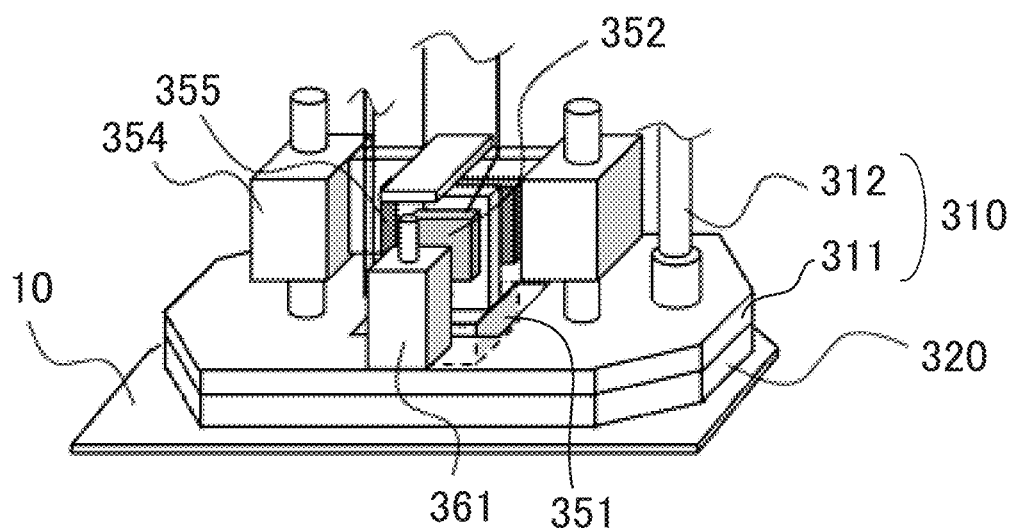
FIG. 14 is another perspective view of the head of the solar panel manufacturing apparatus according to Embodiment 2.

Thus, as illustrated in FIGS. 13 and 14, the solar panel manufacturing apparatus 200 may further include an actuator 361 to drive the heat conductor 351 in the vertical directions relative to the pressing plate 320. Examples of the actuator 361 include an air cylinder and a solenoid.

The solar panel manufacturing apparatus 200 causes the actuator 361 to raise the heat conductor 351, as illustrated in FIG. 13. The solar panel manufacturing apparatus 200 also lowers the heat conductor 351, as illustrated in FIG. 14. The solar panel manufacturing apparatus 200 can thus bring the heat conductor 351 into contact with the solar cell 10 while maintaining the solar cell 10 to be attracted or pressed. The solar panel manufacturing apparatus 200 can also separate the heat conductor 351 from the solar cell 10 while maintaining the solar cell 10 to be attracted or pressed.

While the solar cell 10 is being pressed to spread the adhesive 30, the CPU 401 controls the operations of the actuator 361 and thus raises the heat conductor 351 away from the solar cell 10. The CPU 401 thereby blocks the heat transfer from the heat conductor 351 to the adhesive 30. In contrast, in order to partially cure the adhesive 30, the CPU 401 controls the operations of the actuator 361 and thus lowers the heat conductor 351 and brings the heat conductor 351 into contact with the solar cell 10. The CPU 401 thereby causes heat to be transferred from the heat conductor 351 to the adhesive 30.

When the heat conductor 351 descends, the heat conductor 351 is separated from the actuator 361. In the heating unit 350 having this configuration, the heat conductor 351 recedes so as to passively follow the surface of the solar cell 10 after being brought into contact with the solar cell 10 by the own weight of the heat conductor 351.

In this embodiment, the solar panel manufacturing apparatus 200 can transport the solar cell 10 and press the adhesive 30 while maintaining the heat conductor 351 at a high temperature and away from the solar cell 10. The solar panel manufacturing apparatus 200 can therefore achieve transport of the solar cell 10 and spreading of the adhesive 30 without transferring the heat of the heat conductor 351 to the solar cell 10. The solar panel manufacturing apparatus 200 can also partially heat the adhesive 30 via the solar cell 10 by lowering the heat conductor 351 after spreading of the adhesive 30. In the case where the heater 352 is a general ceramic heater, it takes several tens of seconds to raise the temperature of the heat conductor 351 from approximately 80° C., at which the viscosity of the adhesive 30 does not increase, to approximately 120° C., which is the curing temperature of the adhesive 30, for example. It also takes approximately one to two minutes to lower the temperature of the heat conductor 351 from the curing temperature of the adhesive 30 to a temperature that does not cause an increase in the viscosity of the adhesive 30. The solar panel manufacturing apparatus 200 in Embodiment 1 may have to stop the transport of the solar cell 10 in these temperature-changing periods. In contrast, the solar panel manufacturing apparatus 200 in this embodiment can change an amount of heat transferred to the adhesive 30 without waiting for completion of a temperature change in the heat conductor 351. The solar panel manufacturing apparatus 200 in this embodiment can therefore manufacture a much larger number of solar panels per unit time.

Embodiment 3

Figure 15:
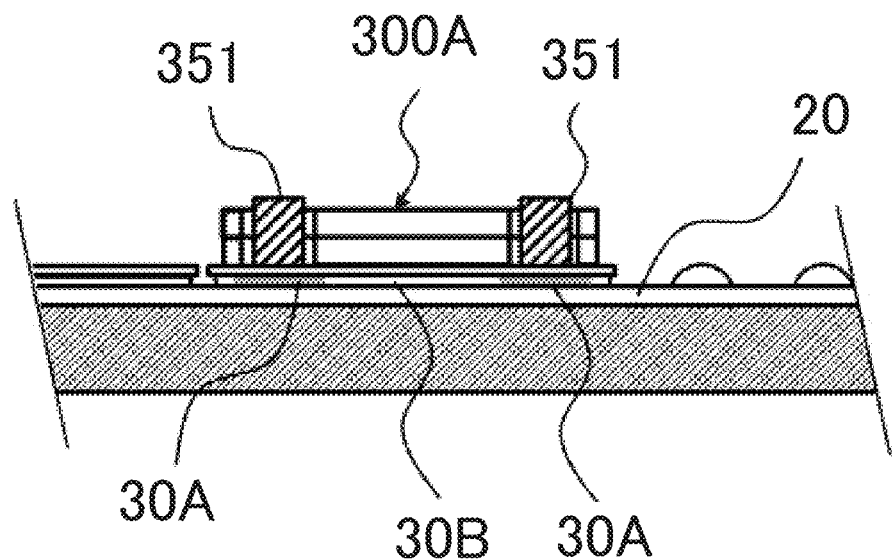
FIG. 15 is a diagram for describing a fourth step of a method of manufacturing a solar panel according to Embodiment 3.
Figure 16:
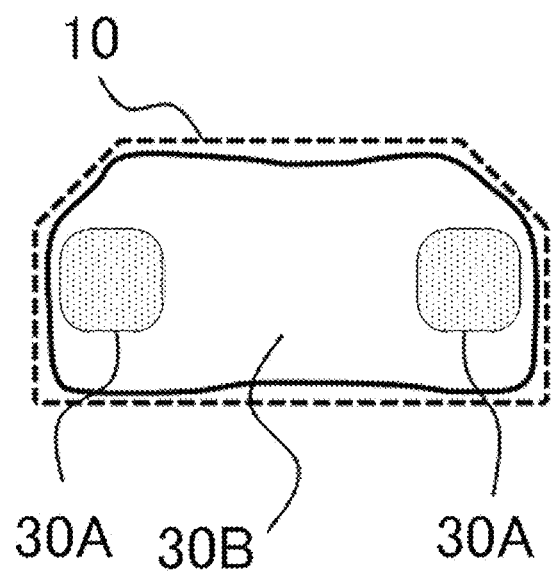
FIG. 16 is a diagram for describing cured portions of an adhesive layer in the fourth step of the method of manufacturing a solar panel according to Embodiment 3.
Figure 17:
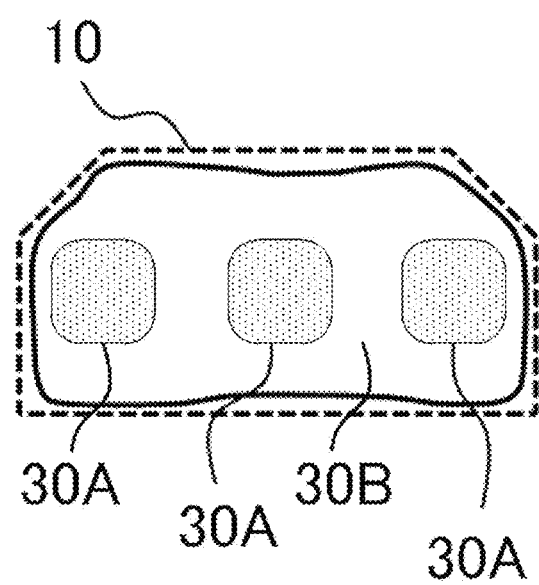
FIG. 17 is another diagram for describing cured portions of an adhesive layer in the fourth step of the method of manufacturing a solar panel according to Embodiment 3.

Although the head 300 includes a single heat conductor 351 in the above-described embodiments, the head 300 may also include a plurality of heat conductors 351. For example, a head 300A of which a side view is illustrated in FIG. 15 includes two heat conductors 351. This configuration yields two cured portions 30A in the layer of the adhesive 30, as illustrated in FIG. 16. Alternatively, the head 300 may include three or more heat conductors 351 and thus yield three or more cured portions 30A in the layer of the adhesive 30, as illustrated in FIG. 17. The heat conductors 351 may also be disposed near a long side of the solar cell 10 in order to stabilize the position of the solar cell 10 during transport of the solar panel 100.

Embodiment 4

Figure 18:
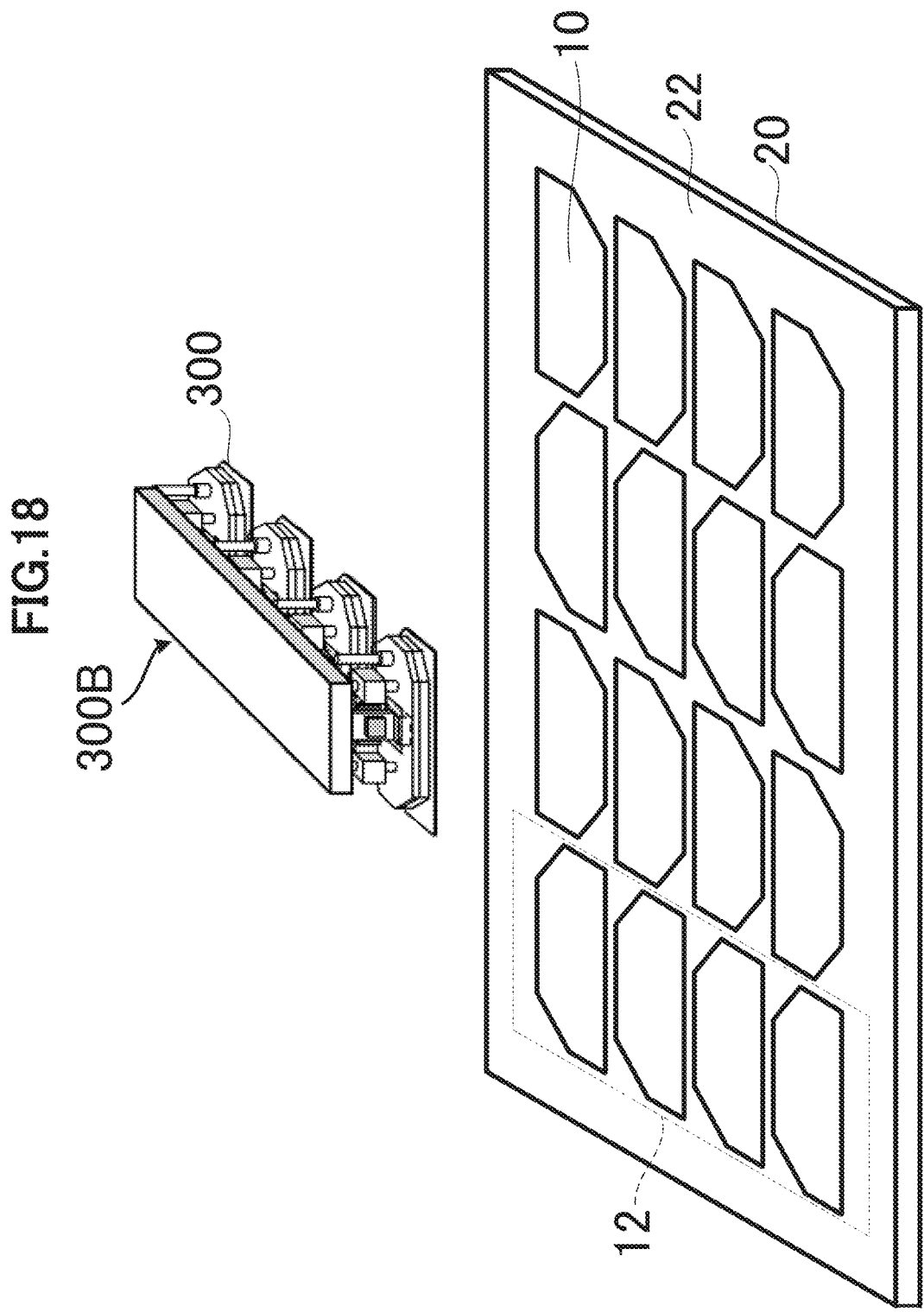
FIG. 18 is a perspective view of a head of a solar panel manufacturing apparatus according to Embodiment 4.

Embodiments 1 to 3 are directed to examples in which the solar cells 10 are arranged on the substrate 20 one by one. Alternatively, a solar cell array 12 including a plurality of solar cells 10 of which electrodes are preliminarily connected to each other may be arranged on the substrate 20. A head 300B in this embodiment includes four successive heads 300 provided in accordance with the four solar cells 10 constituting a single solar cell array 12, as illustrated in FIG. 18. In this case, the positions of the solar cells 10 relative to the substrate 20 may be determined by controlling the position of the head 300B relative to the stage 210 using a pattern recognition technique.

Embodiment 5

Although the pressing plate 320 is made of a single plate in Embodiments 1 to 4, the pressing plate 320 may also be made of a plurality of plates.

Figure 19:
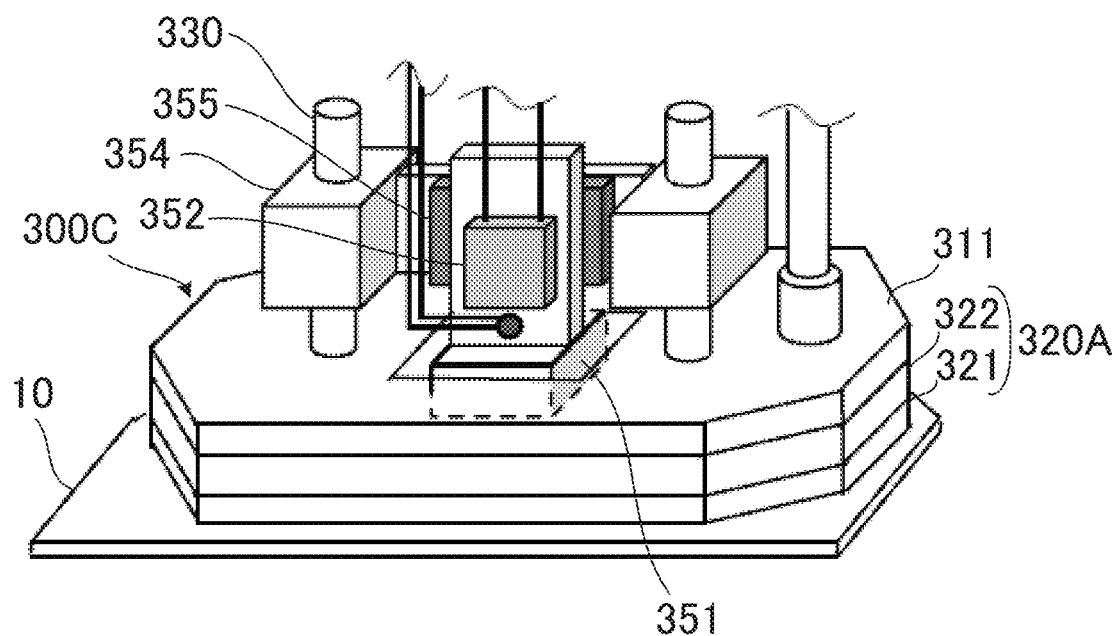
FIG. 19 is a perspective view of a head of a solar panel manufacturing apparatus according to Embodiment 5.

As illustrated in FIG. 19, a head 300C in this embodiment includes a pressing plate 320A including a first plate segment 321 and a second plate segment 322, instead of the pressing plate 320 in Embodiment 1. The pressing plate 320A presses the solar cell 10 on the upper surface of the solar cell 10, like the pressing plate 320 in Embodiment 1. The pressing plate 320A also retains the position of the solar cell 10 relative to the substrate 20. The pressing plate 320A is preferably smaller than the contour shape of the solar cell 10.

The first plate segment 321 is located on the side adjacent to the solar cell 10 and comes into contact with the solar cell 10. The first plate segment 321 includes intake passages open on the lower surface and an opening for accommodating the heating unit 350. The first plate segment 321 preferably has a higher rigidity than the rigidity of the second plate segment 322. For example, the first plate segment 321 preferably has a Young's modulus of at least 100 times as high as the Young's modulus of the second plate segment 322. The first plate segment 321 is made of a metal or monomer cast nylon, for example.

The second plate segment 322 is located on the side opposite to the solar cell 10 and is disposed between the suction plate 311 and the first plate segment 321. The second plate segment 322 includes intake passages in communication with the intake passages of the suction plate 311 and the intake passages of the first plate segment 321, and an opening for accommodating the heating unit 350. The second plate segment 322 is made of an ethylene-propylene-diene monomer rubber, for example.

Figure 20:
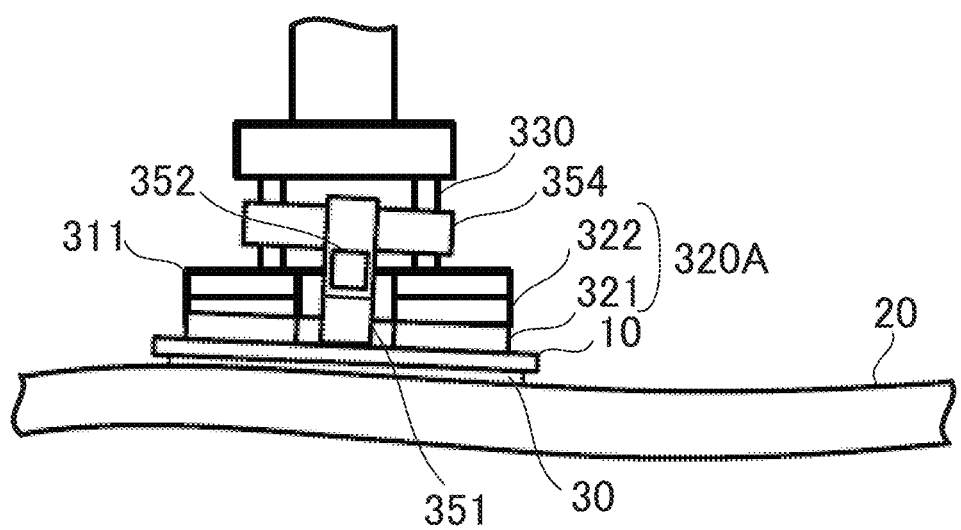
FIG. 20 is a diagram for describing a pressing plate according to Embodiment 5.

In an exemplary case where a plate coming into contact with the solar cell 10 has a low rigidity, the solar cell 10 may be deformed in out-of-plane directions by a pressing force, resulting in non-uniform thickness of the layer of the adhesive 30. In order to solve this problem, the first plate segment 321 located on the side adjacent to the solar cell 10 has a high rigidity in this embodiment, and can thus prevent the solar cell 10 from being deformed in out-of-plane directions, thereby achieving the uniform thickness of the layer of the adhesive 30. In addition, the second plate segment 322 located on the side opposite to the solar cell 10 has a low rigidity and is deformable to absorb waviness, unevenness, and the like of the surface 210a of the stage 210 and the substrate 20, as illustrated in FIG. 20. This configuration can further improve the uniformity of the thickness of the layer of the adhesive 30.

Embodiment 6

Although the heating unit 350 is provided in the head 300 in Embodiments 1 to 5, the heating unit 350 may also be provided in the stage 210.

Figure 21:
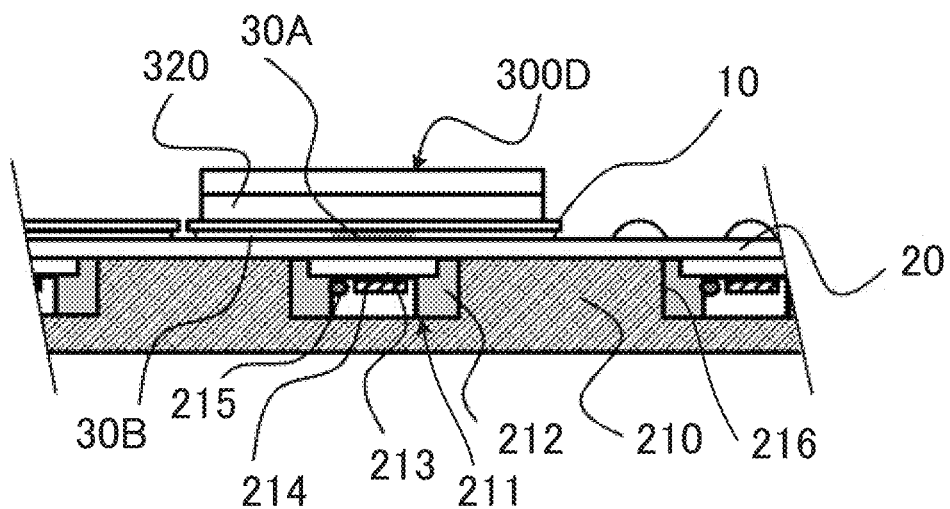
FIG. 21 is a diagram for describing a solar panel manufacturing apparatus according to Embodiment 6.

As illustrated in FIG. 21, a head 300D includes no heating unit 350. Instead, the stage 210 has recesses 216 at the positions of the solar cells 10 to be arranged. The recesses 216 each accommodate a heating unit 211. Specifically, a heat conductor 213 is disposed in the recess 216 via a heat insulator 212. The heat conductor 213 is provided with a heater 214 and a temperature sensor 215. The heat conductors 213 are mutually independent via the heat insulators 212 between the solar cells 10 or between the solar cell arrays 12. This configuration can prevent the temperature of the adhesive 30 that has not received a solar cell 10 or a solar cell array 12 from rising due to the process of bonding the adjacent solar cell 10 or solar cell array 12.

The heat conductor 213 does not have mechanisms of receding and passively following the shape of the surface of the solar cell 10. The heat conductor 213 is fixed on the stage 210. The surface 210a of the stage 210 and the upper surface of the heat conductor 213 are smoothed to have a few protrusions and recesses. The heat conductors 213 are each disposed only at the position facing the center of the solar cell 10 in order to decrease the heart capacity of the heated portion and accelerating the temperature rise in the heat conductor 213 without curing the entire layer of the adhesive 30.

This embodiment is advantageous especially when the substrate 20 has a sheet-like shape. The sheet-like substrate 20 is fixed by a frame at the outer circumference and thus kept from becoming wrinkled or loose, and transported while being fixed by the frame until the end of the subsequent entire curing step.

The head 300D in this embodiment has a simple structure, and the wires to the heaters 214 and the temperature sensors 215 are disposed inside the stage 210 less susceptible to movement. This configuration can facilitate maintenance and adjustment operations of the solar panel manufacturing apparatus 200. In the case of a thin substrate 20, the heating of the adhesive 30 from the side adjacent to the substrate 20 can be achieved with high efficiency. The adhesive 30 can therefore be sufficiently heated by a lower heating temperature. The pressing plate 320 of the head 300 is made of an elastic material and can thus protect the solar cell 10 from a local load. The pressing plate 320 can also reduce damage of the solar cell 10 due to clamping.

Embodiment 7

The adhesive 30 for the solar panel 100 is described in detail in this embodiment. The adhesive 30 bonds the solar cells 10 to the substrate 20. The adhesive 30 for the solar panel 100 is a layer of cured adhesive.

Figure 22:
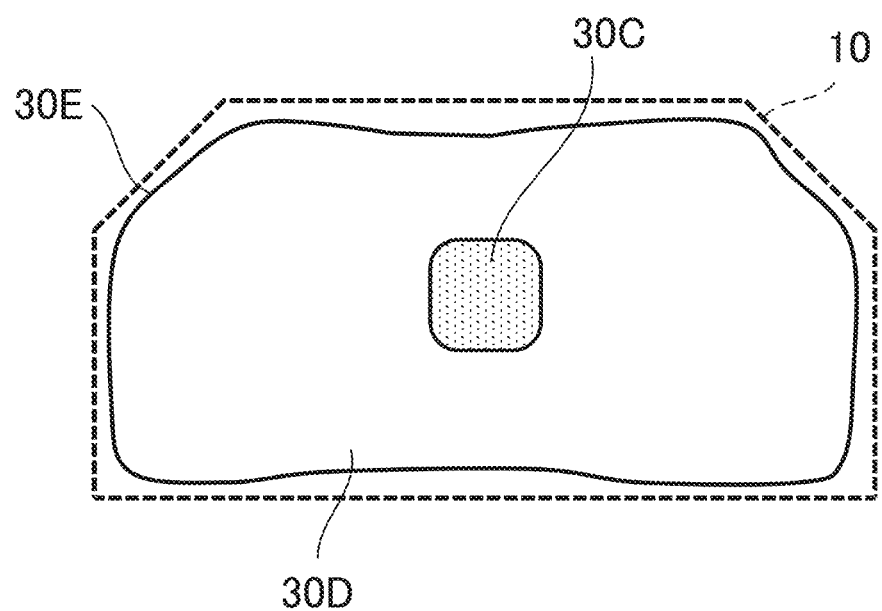
FIG. 22 is a diagram for describing an adhesive of a solar panel according to Embodiment 7.

As illustrated in FIG. 22, the adhesive 30 for the solar panel 100 has a first region 30C that was cured in advance, and a second region 30D that was cured after curing of the first region 30C. The first region 30C corresponds to the cured portion 30A partially cured in the curing step in the method of manufacturing the solar panel 100 in Embodiment 1. The second region 30D corresponds to the uncured portion 30B after being cured in the step of curing the rest of the adhesive 30 in the method of manufacturing the solar panel 100 in Embodiment 1. A single solar cell 10 preferably has one to three first regions 30C. When the solar panel 100 is viewed from above, the first region 30C preferably has an area of at least 20% of the area of the region 30E of the solar cell 10 bonded with the adhesive 30. This configuration can reduce the period required for raising the temperature of the adhesive 30 to the curing temperature, leading to high efficiency in manufacturing the solar panel 100. A reduction in the area of the first region 30C, that is, the cured portion 30A can minimize a change in size of the substrate 20 due to thermal expansion, thereby achieving more accurate arrangement of the solar cells 10.

Modification

In the above-described embodiments, when the solar cell 10 receives a load of at least the reference value, the CPU 401 causes the head 300 to recede on the basis of the value measured at the load meter 230. The structure may also include a linear bushing to support the head 300, so that the heads 300 and 300A to 300D may recede so as to passively follow the surface of the solar cell 10 after coming into contact with the surface of the solar cell 10.

The applicator 40, such as dispenser or brush, the infrared-ray heaters 250, and other components may be included in the solar panel manufacturing apparatus 200, so as to enable the solar panel manufacturing apparatus 200 to solely execute the whole steps illustrated in FIG. 6.

The above-illustrated transport mechanism 220 to transport the head 300 and the solar cell 10 is a mere example. The solar panel manufacturing apparatus 200 may also include a multi-axis robot arm that can transport the heads 300 and 300A to 300D in the X, Y, and 7 directions, for example.

The adhesive 30 is a thermosetting adhesive in the above-described embodiments. The solar panel manufacturing apparatus 200 includes the heating units 211 and 350 to cure the adhesive 30. The adhesive 30 may also be an adhesive other than the thermosetting adhesive. For example, the adhesive 30 may be a light-curing adhesive. In this case, the solar panel manufacturing apparatus 200 includes a curing unit for partially curing the layer of the adhesive 30 in accordance with the characteristics of the adhesive, instead of the heating units 211 and 350. The heating units 211 and 350 are examples of the curing unit.

Although the above-illustrated heads 300 and 300A to 300D hold the solar cell 10 by sucking air, the heads 300 and 300A to 300D may also hold the solar cell 10 by any holding means. For example, the heads 300 and 300A to 300D may grasp the solar cell 10.

The pressing plates 320 and 320A may preferably have a shape corresponding to the shape of the solar cell 10. The pressing plates 320 and 320A may preferably be replaceable depending on the shape of a solar cell 10.

The controller 400 illustrated in FIG. 5, the method of manufacturing a solar panel illustrated in FIG. 6, and the like are also mere examples and are not intended to limit the scope of the controller 400, the method of manufacturing a solar panel, and the like.

Figure 23:
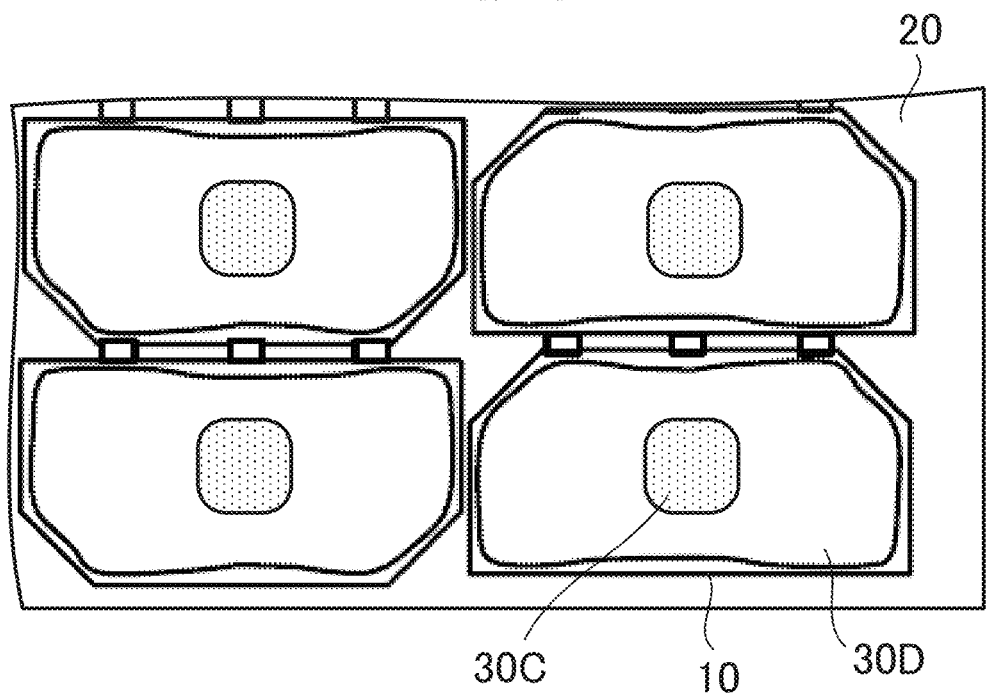
FIG. 23 is a diagram for describing a substrate and an adhesive according to a modification.

The substrate 20 of the solar panel 100 may have light permeability. The substrate 20 may also be a translucent or transparent resin sheet, for example. Because of the substrate 20 having light permeability, the curing level of the adhesive 30, the occupancy of the first region 30C of the adhesive 30, and the like can be visually checked from the side of the substrate 20, as illustrated in FIG. 23. This configuration can facilitate quality examination in the individual manufacturing steps of the solar panel 100. The curing level of the adhesive 30, the occupancy of the first region 30C of the adhesive 30, and the like may also be checked using a device, such as camera or optical sensor.

The foregoing describes some example embodiments for explanatory purposes. Although the foregoing discussion has presented specific embodiments, persons skilled in the art will recognize that changes may be made in form and detail without departing from the broader spirit and scope of the invention. Accordingly, the specification and drawings are to be regarded in an illustrative rather than a restrictive sense. This detailed description, therefore, is not to be taken in a limiting sense, and the scope of the invention is defined only by the included claims, along with the full range of equivalents to which such claims are entitled.

This application claims the benefit of Japanese Patent Application No. 2019-237775, filed on Dec. 27, 2019, the entire disclosure of which is incorporated by reference herein.

REFERENCE SIGNS LIST

10 Solar cell
11 Wire
12 Solar cell array
20 Substrate
22 Main surface
30 Adhesive
30A Cured portion of adhesive
30B Uncured portion of adhesive
30C First region
30D Second region
30E Region of a solar cell bonded with an adhesive
40 Applicator
100 Solar panel
200 Solar panel manufacturing apparatus
210 Stage
210a Surface
211 Heating unit
212 Heat insulator
213 Heat conductor
214 Heater
215 Temperature sensor
216 Recess
220 Transport mechanism
222 X-direction driver
224 Y-direction driver
226 Z-direction driver
230 Load meter
240 Joint
250 Infrared-ray heater
300, 300A, 300B, 300C, 300D Head
310 Suction unit
311 Suction plate
312 Vacuum pipe
313 Suction driver
320, 320A Pressing plate
321 First plate segment
322 Second plate segment
330 Support
350 Heating unit
351 Heat conductor
352 Heater
353 Temperature sensor
354 Support
355 Heat insulator
361 Actuator
400 Controller
401 CPU
402 ROM
403 RAM
404 Input-output interface

The invention claimed is:

1. A solar panel manufacturing apparatus, comprising:
a stage configured to receive a substrate;
a pressing plate configured to retain a position of a solar cell relative to the substrate, to press an adhesive applied on the substrate and thereby spread the adhesive via the solar cell, and to retain the position of the solar cell relative to the substrate while the adhesive is being pressed, the solar cell being arranged at a predetermined position on the adhesive;
a head configured to arrange the solar cell at the predetermined position on the adhesive applied on the substrate and to transport the solar cell, the pressing plate being provided in the head, and the head comprises a support configured to support a curing unit such that the curing unit is shiftable in a direction in which the pressing plate presses the adhesive; and
the curing unit is configured to cure only a part of the adhesive spread between the substrate and the solar cell to a strength for retaining the position of the solar cell relative to the substrate, in a state in which the pressing plate presses the adhesive and retains the position of the solar cell relative to the substrate, and to shift relative to the pressing plate while the pressing plate is retaining the solar cell, and thereby remain in contact with the solar cell.

2. The solar panel manufacturing apparatus according to claim 1, wherein the curing unit is configured to heat only a part of the adhesive to a temperature of at least a curing temperature.

3. The solar panel manufacturing apparatus according to claim 1, wherein
the curing unit is partially disposed inside an opening of the pressing plate.

4. The solar panel manufacturing apparatus according to claim 1, wherein the head further comprises a driver configured to cause the curing unit to recede from a position in contact with the solar cell.

5. The solar panel manufacturing apparatus according to claim 4, wherein the driver is configured to cause the curing unit to recede to a position not in contact with the solar cell while the pressing plate is pressing the adhesive via the solar cell, and then to cause the curing unit to shift to the position in contact with the solar cell for curing of the adhesive.

6. The solar panel manufacturing apparatus according to claim 1, wherein the head comprises a suction unit configured to attract the solar cell.

7. The solar panel manufacturing apparatus according to claim 1, wherein the pressing plate includes a plurality of plate segments.

8. The solar panel manufacturing apparatus according to claim 7, wherein
the pressing plate includes a first plate segment configured to be located on a side adjacent to the solar cell and a second plate segment configured to be located on a side opposite to the solar cell, and
the first plate segment has a higher rigidity than a rigidity of the second plate segment.

9. The solar panel manufacturing apparatus according to claim 1, wherein a surface of the stage on which the substrate is placed is made of a resin.

10. The solar panel manufacturing apparatus according to claim 1, further comprising an applicator to apply the adhesive on the substrate.

11. A method of manufacturing a solar panel, comprising:
an arranging step of transporting, by a head, a solar cell, and of arranging the solar cell at a predetermined position on an adhesive of a substrate;
a pressing step of retaining, by a pressing plate provided in the head, a position of the solar cell relative to the substrate and pressing, by the pressing plate, the adhesive via the solar cell arranged at the predetermined position and thereby spreading the adhesive between the substrate and the solar cell;
a curing step of curing, by a curing unit supported on a support of the head and the curing unit being shiftable in a direction in which the pressing plate presses the adhesive, only a part of the spread adhesive to a strength for retaining the position of the solar cell relative to the substrate in a state in which the adhesive is pressed and the position of the solar cell is retained relative to the substrate, by the pressing plate retaining the position of the solar cell relative to the substrate while the adhesive is being pressed; and
a step of curing rest of the spread adhesive, after repetition of the pressing step and the curing step a plurality of times.

12. A solar panel produced by the method according to claim 11.

13. The solar panel according to claim 12, wherein the adhesive includes a first region and a second region, the second region being cured after the curing of the first region, and the first region of the adhesive has an area of at least 20% of an area of a region of the solar cell bonded with the adhesive when the solar panel is viewed from above.

14. The solar panel according to claim 12, wherein the substrate has light permeability.

15. The solar panel manufacturing apparatus according to claim 1, further comprising:
the substrate.

16. The solar panel manufacturing apparatus according to claim 15, further comprising:
the solar cell.

* * * * *